United States Patent
Kim et al.

(10) Patent No.: US 12,295,210 B2
(45) Date of Patent: May 6, 2025

(54) ELECTROLUMINESCENT DISPLAY DEVICE HAVING PIXEL DRIVING CIRCUIT

(71) Applicant: LG Display Co., Ltd., Seoul (KR)

(72) Inventors: JinYeong Kim, Goyang-si (KR); HyeonHo Son, Goyang-si (KR); SeongHwan Ju, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 483 days.

(21) Appl. No.: 17/870,622

(22) Filed: Jul. 21, 2022

(65) Prior Publication Data
US 2023/0146875 A1 May 11, 2023

(30) Foreign Application Priority Data
Nov. 5, 2021 (KR) ........................ 10-2021-0151341

(51) Int. Cl.
*H10K 59/12* (2023.01)
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ............. H10K 59/1213; H10K 59/131; H10K 59/1216
USPC ........................................................ 257/40
See application file for complete search history.

(56) References Cited

U.S. PATENT DOCUMENTS

| | | | |
|---|---|---|---|
| 10,019,947 B2 | 7/2018 | Zhou | |
| 10,475,391 B2 | 11/2019 | Lu et al. | |
| 10,529,289 B2 | 1/2020 | Chung et al. | |
| 10,755,643 B2 | 8/2020 | Yoshida | |
| 10,964,264 B1 * | 3/2021 | Kim | ............ G09G 3/3291 |
| 11,004,397 B2 | 5/2021 | Kobayashi et al. | |
| 11,081,594 B2 | 8/2021 | Choi et al. | |
| 11,145,252 B2 | 10/2021 | Hung et al. | |
| 11,355,064 B2 | 6/2022 | Jeon et al. | |
| 11,455,960 B2 | 9/2022 | Zhang et al. | |
| 11,501,711 B2 | 11/2022 | Hwang et al. | |
| 11,631,364 B2 | 4/2023 | Ko et al. | |
| 2017/0154576 A1 | 6/2017 | Sun | |
| 2019/0378460 A1 | 12/2019 | Hung et al. | |

(Continued)

FOREIGN PATENT DOCUMENTS

| | | | |
|---|---|---|---|
| CN | 107492351 A | 12/2017 | |
| CN | 108922475 A | 11/2018 | |

(Continued)

OTHER PUBLICATIONS

Cite the machine translation Ohhashi S (WO-2008093451-A1).*
Cite the machine translation Jeong M (KR-20210079659-A).*

*Primary Examiner* — Phuc T Dang
(74) *Attorney, Agent, or Firm* — Seed IP Law Group LLP

(57) ABSTRACT

An electroluminescent display device having pixel driving circuit is disclosed. The display device includes a pixel that includes sub-pixels and is divided into a sub-pixel area where the sub-pixels and a first pixel driving circuit are disposed and a common area where a second pixel driving circuit is disposed. Each of the sub-pixels includes a light emitting element including an anode electrode and a cathode electrode. The anode electrode is connected to a first common line which is connected to the second pixel driving circuit.

19 Claims, 7 Drawing Sheets

(56) References Cited

U.S. PATENT DOCUMENTS

| | | | |
|---|---|---|---|
| 2020/0219446 A1 | 7/2020 | Yoshida | |
| 2021/0327341 A1* | 10/2021 | Kim | ............... H01L 27/124 |
| 2023/0042966 A1 | 2/2023 | Huangfu et al. | |

FOREIGN PATENT DOCUMENTS

| | | | | |
|---|---|---|---|---|
| CN | 109727579 A | | 5/2019 | |
| CN | 110047437 A | | 7/2019 | |
| CN | 110364120 A | | 10/2019 | |
| CN | 110706652 A | | 1/2020 | |
| CN | 111095392 A | | 5/2020 | |
| CN | 111326100 A | | 6/2020 | |
| CN | 111354787 A | | 6/2020 | |
| CN | 111429836 A | | 7/2020 | |
| CN | 111627387 A | | 9/2020 | |
| CN | 112614462 A | | 4/2021 | |
| JP | 2010122320 A | | 6/2010 | |
| KR | 20210079659 A | * | 6/2021 | ......... H10K 59/1213 |
| WO | WO-2008093451 A1 | * | 8/2008 | ........... G09G 3/3233 |
| WO | WO 2019058474 A1 | | 3/2019 | |
| WO | WO 2020027445 A1 | | 2/2020 | |

* cited by examiner

ELECTROLUMINESCENT DISPLAY DEVICE HAVING PIXEL DRIVING CIRCUIT

CROSS-REFERENCE TO RELATED APPLICATIONS

This application claims the priority of Korean Patent Application No. 10-2021-0151341 filed on Nov. 5, 2021, in the Korean Intellectual Property Office, the disclosure of which is incorporated herein by reference.

BACKGROUND

Technical Field

The present disclosure relates to an electroluminescent display device having a pixel driving circuit and relates to an electroluminescent display panel in which bright spot and image quality defects are improved.

Description of the Related Art

With the development of information technology, the market for display devices, which are connection media between information and users, is growing. Various forms of communication are actively performed between users beyond the transfer of text-based information. As the type of information changes, the performance of a display device for displaying information is also developing. Accordingly, the use of various types of display devices, such as electroluminescent display devices, liquid crystal display devices, and quantum dot display devices, is increasing. Among them, electroluminescent display devices can be classified into organic light emitting display devices and inorganic light emitting display devices depending on the type of light emitting elements. Also, the inorganic light emitting display devices include a light emitting diode (LED) display device.

An organic light emitting display device includes organic light emitting diodes (OLEDs) capable of emitting light by themselves. An LED display device includes light emitting diodes (LEDs) capable of emitting light by themselves. In the organic light emitting display device or the LED display, pixels each including a light emitting element are aligned in a specific pattern and the brightness of the pixels is adjusted depending on the grayscale of image data. Each pixel includes a driving element (or driving transistor) configured to control a driving current flowing in a light emitting element depending on a gate-to-source voltage. Each pixel also includes one or more switching elements (or switching transistors) configured to program the gate-to-source voltage of the driving element. In each pixel, the display grayscale (or brightness) is adjusted by a light emission amount of the light emitting element depending on the driving current.

Recently, interest in and development of LED display devices using LEDs, which are light emitting elements including inorganic layers, is increasing. LEDs can output grayscale with a higher brightness than OLEDs and have excellent reliability against heat, moisture, oxygen, etc.

BRIEF SUMMARY

In order to achieve a uniform image quality without brightness and color difference between pixels, it is beneficial for the driving characteristics be the same or substantially the same in all the pixels. However, there may be deviations in the driving characteristics between the pixels due to various causes including process deviations. Also, a degradation speed may be different between the pixels depending on the driving time of the display device. Therefore, there may be deviations in the driving characteristics between the pixels. Accordingly, the amount of driving current flowing to the light emitting element can be changed depending on a driving characteristic deviation between the pixels, which results in non-uniformity in image quality.

In order to compensate for a driving characteristic deviation, the pixels include an internal compensation pixel driving circuit or an external compensation pixel driving circuit. These pixel driving circuits are implemented by the above-described driving element and switching element, and a capacitor. Driving characteristics, such as reliability of a pixel driving circuit and a deviation in driving current, may vary depending on the connection relationship of the elements of the pixel driving circuit and the driving method thereof.

The above-described driving element or switching element may be implemented by a thin film transistor (hereinafter, referred to as "transistor"). The transistor is composed of a semiconductor layer, an electrode layer and a plurality of insulating layers. However, the insulating layers may be damaged due to static electricity generated when the transistor is formed, which may cause a defect in the transistor. This may cause an image quality defect, particularly, a bright spot defect, in an electroluminescent display device. In particular, as for an LED display device, a driving current for high brightness is needed to cause LEDs to emit light. Thus, a bright spot may result in an image quality defect. In order to solve the problem of static electricity generation, direct measures may be taken in the process equipment to suppress static electricity generation. However, it is technically challenging to completely suppress static electricity generation. Therefore, it is beneficial to implement a pixel driving circuit in which static electricity is not recognized as a defect even if static electricity is generated therein. In other words, it is beneficial to invent a pixel driving circuit capable of reducing the generation of bright spots and then apply the pixel driving circuit to a display panel.

One or more embodiments of the present disclosure have been provided considering the various technical problems in the related art including the ones identified above.

One or more embodiments of the present disclosure provide an electroluminescent display device including a pixel driving circuit. The pixel driving circuit is implemented such that a pixel included in a display panel is not seen as a bright spot when a defect caused by static electricity is generated.

One or more embodiments of the present disclosure provide an electroluminescent display device whose integration density is improved by more simply configuring a pixel driving circuit composed of a plurality of transistors.

One or more embodiments of the present disclosure provide an electroluminescent display device including a pixel driving circuit. The pixel driving circuit is implemented such that a pixel included in a display panel is seen as a dark spot when a defect caused by static electricity is generated.

The technical benefits of the present disclosure are not limited to the above-mentioned benefits, and other benefits, which are not mentioned above, can be clearly understood by those skilled in the art from the following descriptions.

According to an aspect of the present disclosure, the electroluminescent display device includes a pixel that includes sub-pixels and is divided into a sub-pixel area where the sub-pixels are disposed and a common area. Each of the sub-pixels includes a light emitting element including an anode electrode and a cathode electrode. In the sub-pixel area, a first pixel driving circuit is disposed, and in the common area, a second pixel driving circuit is disposed. The anode electrode of the light emitting element is connected to a first common line which is connected to the second pixel driving circuit. Each of the sub-pixels also includes a driving element including a source connected to a first node, a gate connected to a second node, and a drain connected to a third node. The sub-pixel also includes a fourth transistor connected to the first node, a second transistor connected to the second node, and a fifth transistor connected to the third node. The sub-pixel further includes a third transistor connected to the second node and the third node, and a first capacitor connected to the second node and a second common line which is connected to the second pixel driving circuit. The sub-pixel also includes a second capacitor connected to the first common line and the first node or the second node, and a conductive layer disposed under the driving element. The conductive layer is connected to the first node or the gate of the driving element. In this case, when a defect is generated in a sub-pixel of the electroluminescent display device due to static electricity, the sub-pixel is darkened. Thus, it is possible to reduce an image quality defect.

According to another aspect of the present disclosure, the electroluminescent display device includes a light emitting element including an anode electrode connected to a first common line supplied with a high-potential voltage and a cathode electrode. The electroluminescent display device also includes a sub-pixel including a pixel driving circuit that supplies a driving current to the light emitting element. The sub-pixel further includes a driving element including a source connected to a first node, a gate connected to a second node, and a drain connected to a third node. The sub-pixel also includes a first common switching circuit connected to the anode electrode and a first capacitor including a first electrode connected to the second node and a second electrode connected to a fourth node. The sub-pixel further includes a second switching circuit connected to the second node and a third switching circuit connected to the third node. The sub-pixel also includes a first switching circuit connected to the first node and a second common switching circuit connected to the fourth node. Accordingly, when a defect is generated in a sub-pixel of the electroluminescent display device due to static electricity, the sub-pixel is darkened. Thus, it is possible to reduce an image quality defect.

Other matters of the embodiments are included in the detailed description and the drawings.

According to the present disclosure, a pixel driving circuit including two capacitors connected to a gate of a driving element is implemented in a sub-pixel. Thus, it is possible to suppress the generation of a bright spot defect in an electroluminescent display panel.

According to the present disclosure, an anode electrode of a light emitting element is shared by a plurality of sub-pixels and a cathode electrode is configured to be supplied with a driving current from a driving element. Thus, it is possible to suppress the generation of a bright spot in an electroluminescent display panel.

According to the present disclosure, sub-pixels included in a unit pixel share a part of a pixel driving circuit disposed in the unit pixel. Therefore, a non-emission area in the unit pixel can be reduced, and, thus, the resolution of a display panel can be increased.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
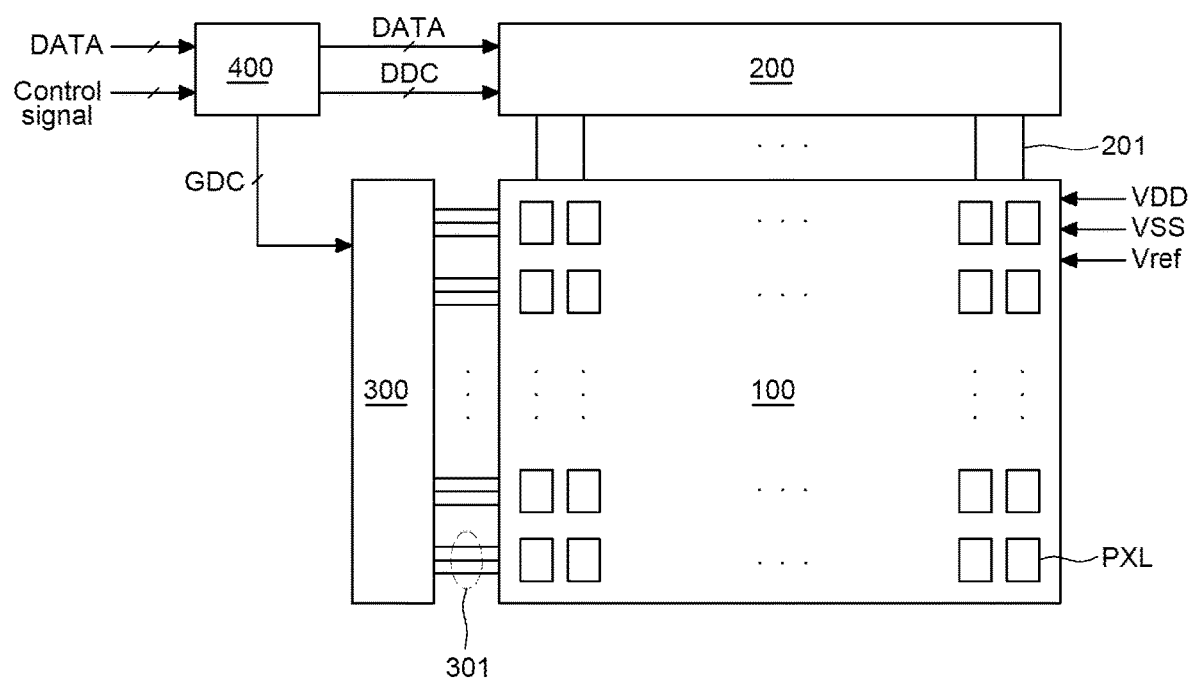
FIG. 1 is a block diagram illustrating an electroluminescent display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components.

Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

According to the present disclosure, a driving circuit and a gate driving circuit formed on a substrate of a display panel may be implemented by N-type or P-type transistors. For example, a transistor may be implemented by a MOSFET (metal oxide semiconductor field effect transistor). The transistor is a three-electrode element including a gate, a source, and a drain. The source is an electrode that supplies carriers to the transistor. In the transistor, carriers flow from the source to the drain. In the n-type transistor, carriers are electrons, and, thus, electrons flow from the source to the drain and a source voltage is lower than a drain voltage. Since electrons flow from the source to the drain in the N-type transistor, a current flows from the drain to the source. In the P-type transistor, carriers are holes, and, thus, a source voltage is higher than a drain voltage so that holes can flow from the source to the drain. Since holes flow from the source to the drain in the P-type transistor, a current flows from the source to the drain. The source and the drain of a transistor are not fixed and may be interchanged depending on voltages applied thereto.

In the following description, a gate-on signal is a gate signal that turns on a transistor. A gate-off signal is a gate signal that turns off a transistor. In the P-type transistor, the gate-on signal is a logic low voltage and the gate-off signal is a logic high voltage. In the N-type transistor, the gate-on signal is a logic high voltage and the gate-off signal is a logic low voltage.

Hereinafter, a pixel driving circuit and an electroluminescent display device including the same according to an embodiment of the present disclosure will be described with reference to the accompanying drawings.

Figure 2:
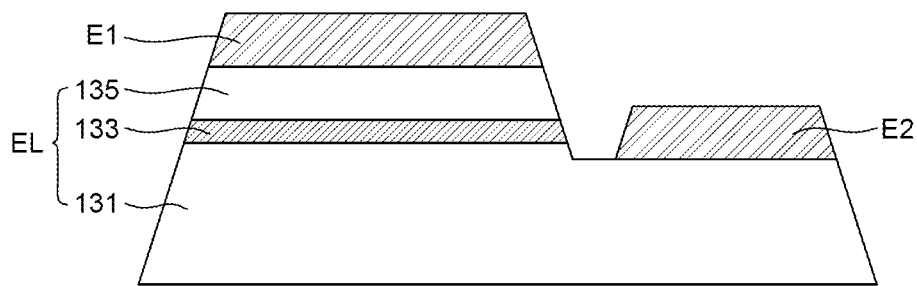
FIG. 2 illustrates an embodiment of a light emitting element included in each pixel of an electroluminescent display panel.

FIG. 1 is a block diagram illustrating an electroluminescent display device according to an embodiment of the present disclosure. FIG. 2 illustrates an embodiment of a light emitting element included in each pixel of an electroluminescent display panel.

Referring to FIG. 1 and FIG. 2, an electroluminescent display device according to the present disclosure includes a display panel 100 including pixels PXL. Also, the electroluminescent display device includes display panel driving circuits 200 and 300 configured to supply signals to signal lines connected to the pixels PXL. Further, the electroluminescent display device includes a timing controller 400 configured to control the display panel driving circuits 200 and 300.

The display panel driving circuits 200 and 300 supply input image data to the pixels PXL of the display panel 100. The display panel driving circuits 200 and 300 include a source driver 200 configured to supply data signals to data lines 201 connected to the pixels PXL and a gate driver 300 configured to supply gate signals to gate lines 301 connected to the pixels PXL.

The display panel 100 is provided with a plurality of data lines 201 and a plurality of gate lines 301. Each of the pixels PXL is driven in response to a signal supplied by the data lines 201 and the gate lines 301. Thus, an area for each of the pixels PXL may be defined by the data lines 201 and the gate lines 301. Each pixel PXL includes a light emitting element 130 such as an LED shown in FIG. 2.

The light emitting element 130 may include an emission layer EL, a first electrode E1, and a second electrode E2. The emission layer EL emits light as electrons and holes flowing between the first electrode E1 and the second electrode E2 are recombined. The emission layer EL may include a first semiconductor layer 131, an active layer 133 and a second semiconductor layer 135.

The first semiconductor layer 131 supplies electrons to the active layer 133. For example, the first semiconductor layer 131 may be made of an n-GaN semiconductor material. The n-GaN semiconductor material may be GaN, AlGaN, InGaN, AlInGaN, or the like. As impurities used for doping the first semiconductor layer 131, Si, Ge, Se, Te, C, or the like may be used.

The active layer 133 is provided on one side of the first semiconductor layer 131. The active layer 133 has a multi-quantum well (MQW) structure having a well layer and a barrier layer having a higher bandgap than that of the well layer. The active layer 133 may have a MQW structure such as InGaN/GaN or the like.

The second semiconductor layer 135 is provided on the active layer 133 and supplies holes to the active layer 133. The second semiconductor layer 135 may be made of a p-GaN semiconductor material. The p-GaN semiconductor material may be GaN, AlGaN, InGaN, AlInGaN, or the like. As impurities used for doping the second semiconductor layer 135, Mg, Zn, Be, or the like may be used.

The first semiconductor layer 131, the active layer 133, and the second semiconductor layer 135 may be sequentially laminated on a semiconductor substrate. The semiconductor substrate includes a semiconductor material such as a sapphire substrate or a silicon (Si) substrate. The semiconductor substrate may be used as a substrate for growing each of the first semiconductor layer 131, the active layer 133, and the second semiconductor layer 135 and then may be separated from the first semiconductor layer 131 via a substrate separating process. The substrate separating process may be a laser lift off process or chemical lift off process. The light emitting element 130 from which the semiconductor substrate has been separated is transferred to each of the pixels PXL and connected to a pixel driving circuit.

The first electrode E1 is provided on the second semiconductor layer 135. The second electrode E2 may be provided on the other side of the first semiconductor layer 131 so as to be electrically disconnected from the active layer 133 and the second semiconductor layer 135. For example, each of the first electrode E1 and the second electrode E2 may be made of a transparent conductive material. The transparent conductive material may be indium tin oxide (ITO), indium zinc oxide (IZO), or the like, but is not limited thereto. Alternatively, each of the first electrode E1 and the second electrode E2 may be made of at least one of metal materials such as Au, W, Pt, Si, Ir, Ag, Cu, Ni, Ti, or Cr and alloys thereof.

Light emitted from the light emitting element 130 passes through each of the first electrode E1 and the second electrode E2 and is output to the outside, thereby displaying an image. The first electrode E1 of the light emitting element 130 may also be referred to as an anode electrode and the second electrode E2 may also be referred to as a cathode electrode.

Figure 3:
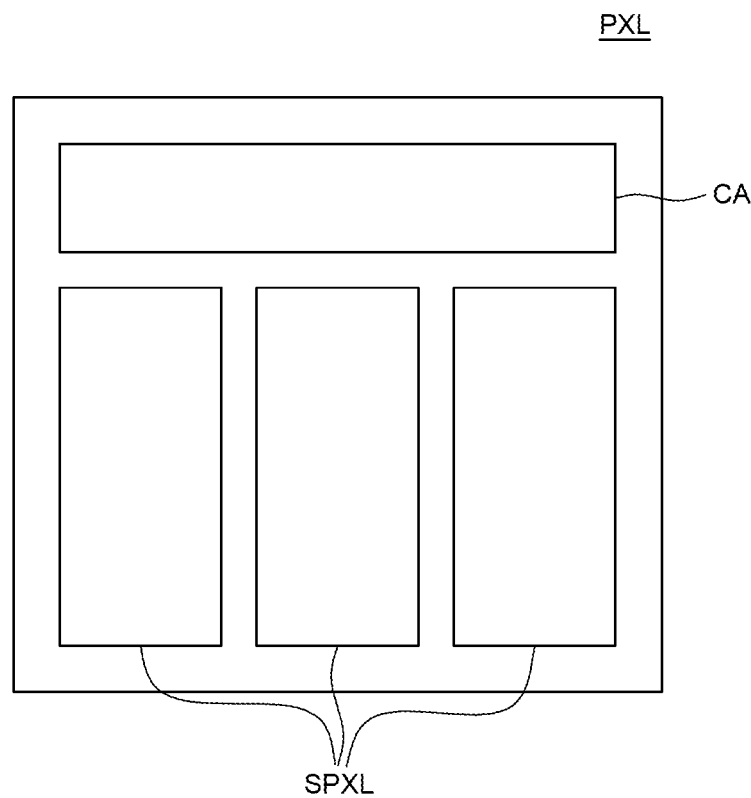
FIG. 3 illustrates a layout of sub-pixels included in a unit pixel of the electroluminescent display panel.

FIG. 3 illustrates a layout of sub-pixels included in a unit pixel of the electroluminescent display panel.

Each pixel PXL includes a plurality of sub-pixels SPXL. Each area where the sub-pixels SPXL are disposed may also be referred to as a sub-pixel area. Each of the sub-pixels SPXL may be any one of a red sub-pixel, a green sub-pixel, a blue sub-pixel, and a white sub-pixel to implement various colors. A color implemented in the pixel PXL can be determined depending on the emission ratio of the red sub-pixel, the green sub-pixel, the blue sub-pixel, and the white sub-pixel. Each of the sub-pixels SPXL includes the light emitting element 130 for emitting light of the color of the corresponding sub-pixel SPXL and a pixel driving circuit. Further, in order to reduce or minimize the size of the pixel driving circuit, a part of the pixel driving circuit may be shared by the sub-pixels SPXL. The pixel driving circuit shared by the sub-pixels SPXL may be disposed in a common area CA. A unit pixel PXL includes a plurality of sub-pixel areas and a common area CA. The pixel driving circuit disposed in the common area CA will be described in detail later.

Referring to FIG. 1 again, the sub-pixels SPXL are respectively supplied with power voltages through power supply lines in addition to the data lines 201 and the gate lines 301. The power supply lines may also be shared by the plurality of the sub-pixels SPXL. The power voltages are supplied from a power supply unit, and include a high-potential voltage VDD, a low-potential voltage VSS, and a reference voltage Vref. The sub-pixels SPXL are supplied with the high-potential voltage VDD through a first power supply line, the low-potential voltage VSS through a second power supply line, and the reference voltage Vref through a third power supply line. For example, the high-potential voltage VDD may be lower than the reference voltage Vref and higher than the low-potential voltage VSS. In this case, the high-potential voltage VDD and the reference voltage Vref may be positive voltages, and the low-potential voltage VSS may be a negative voltage. The structure of the power supply lines connected to the sub-pixels SPXL has a linear shape and a plate shape extending over two or more sub-pixels SPXL.

The source driver 200 converts the input image data received from the timing controller 400 into a data voltage Vdata in each frame and then supplies the data voltage Vdata to the data lines 201. The source driver 200 outputs the data voltage Vdata using a digital-to-analog converter (DAC) that converts the input image data into a gamma compensation voltage. For example, the data voltage Vdata may be a voltage between the low-potential voltage VSS and the high-potential voltage VDD.

The gate driver 300 may be formed directly on a substrate of the display panel 100 together with the pixels PXL by a gate-in-panel process, but the present disclosure is not limited thereto. The gate driver 300 may be manufactured in an IC (integrated circuit) type and then bonded to the display panel 100 by a conductive film.

The timing controller 400 generates a data timing control signal DDC for controlling the operation timing of the source driver 200 based on a timing control signal received from a non-illustrated host system. The timing controller 400 also generates a gate timing control signal GDC for controlling the operation timing of the gate driver 300 based on a timing control signal received from the non-illustrated host system. For example, the timing control signals include a vertical sync signal Vsync, a horizontal sync signal Hsync, a data enable signal DE, etc.

Figure 4A:
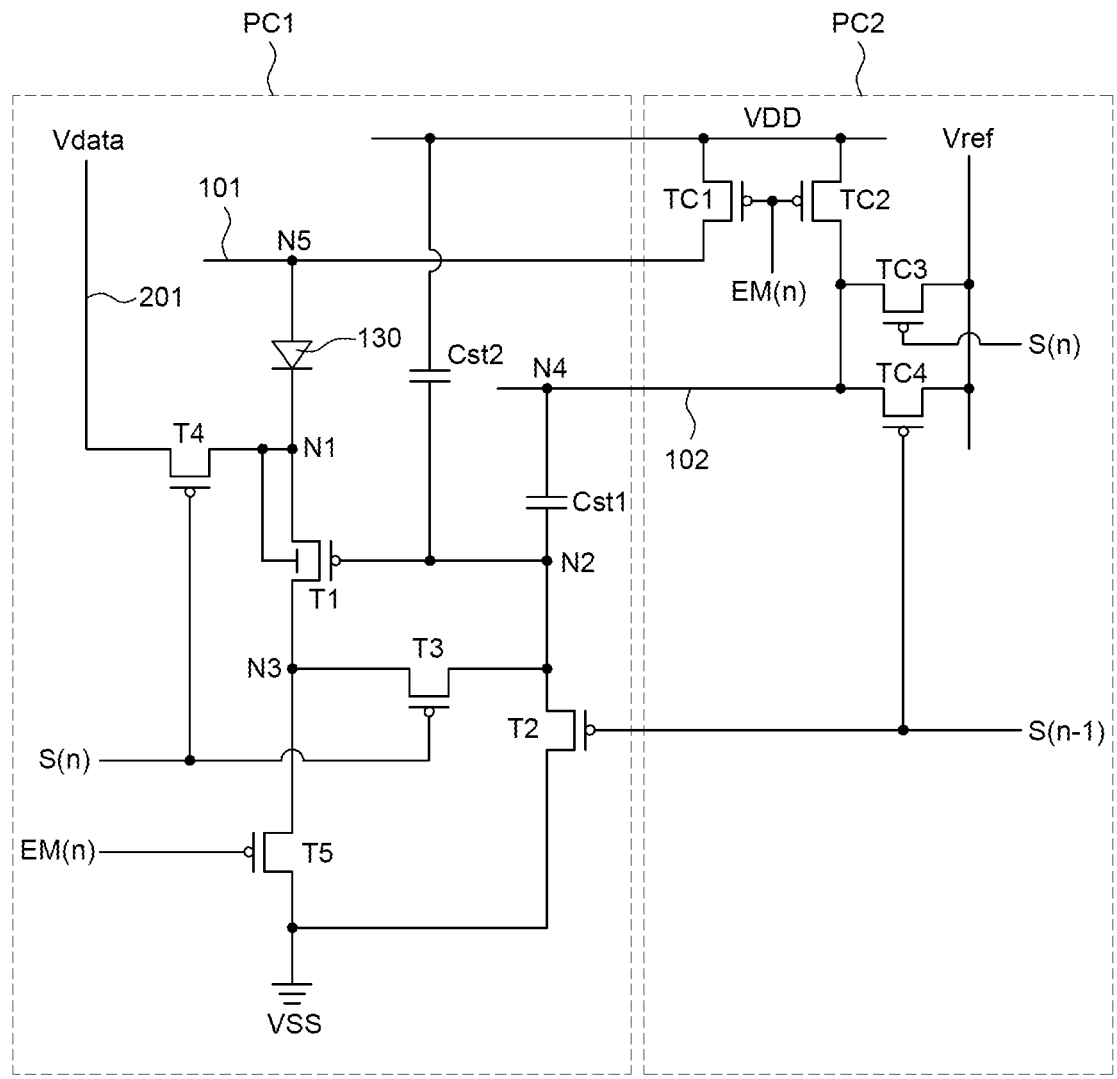
FIG. 4A, FIG. 4B and FIG. 5 show a pixel driving circuit according to an embodiment of the present disclosure and a waveform chart of a signal input to the pixel driving circuit.
Figure 4B:
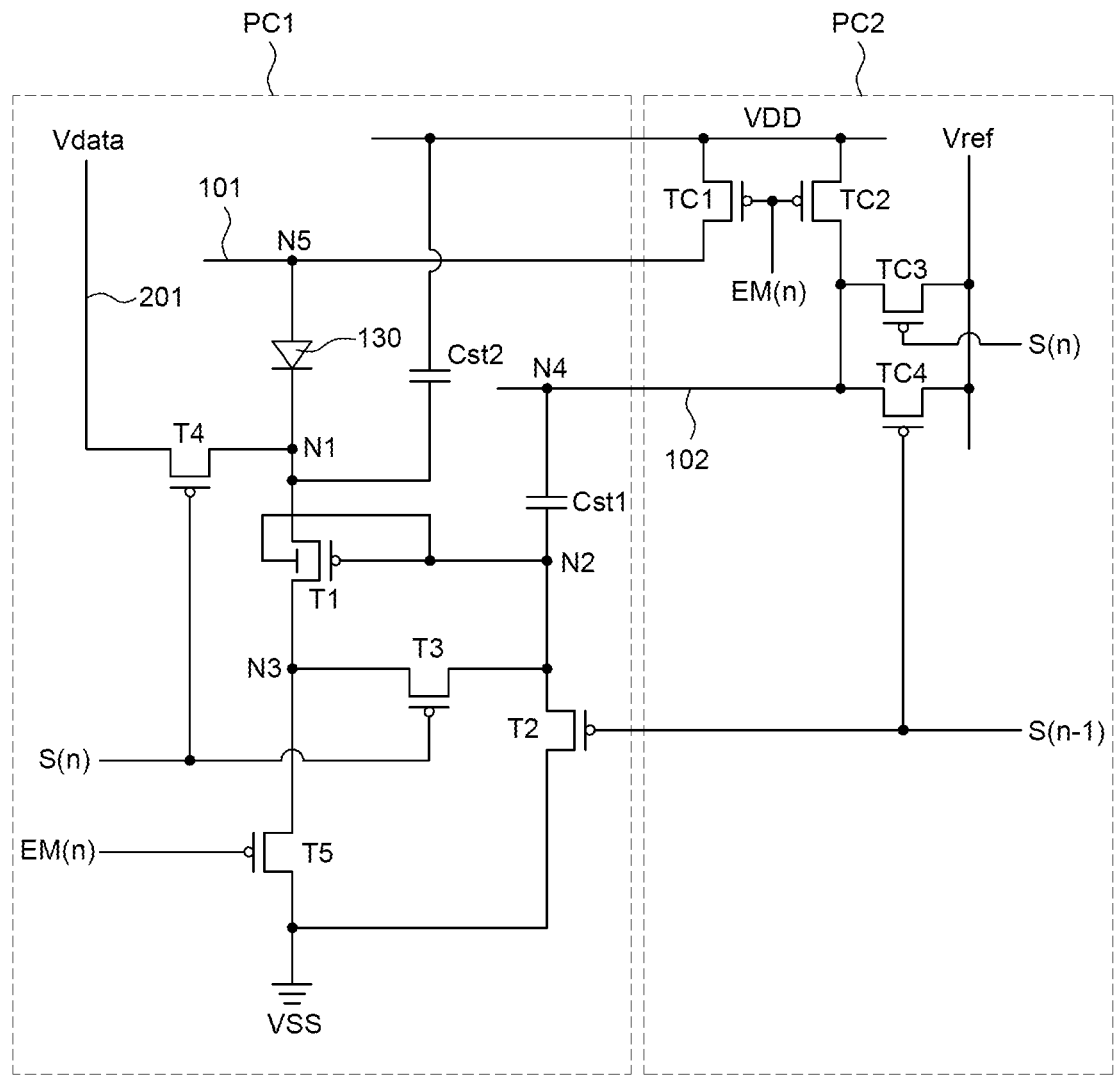
Figure 5:
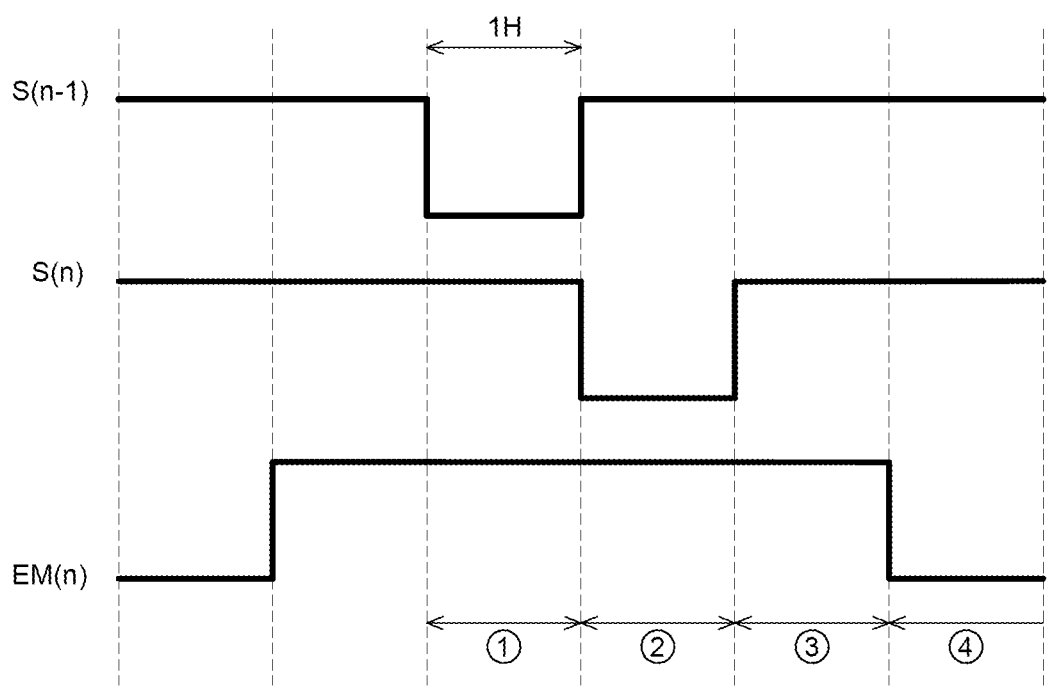

FIG. 4A, FIG. 4B and FIG. 5 show a pixel driving circuit according to an embodiment of the present disclosure and a waveform chart of a signal input to the pixel driving circuit.

Referring to FIG. 4A, the pixel driving circuit according to an embodiment of the present disclosure includes a first pixel driving circuit PC1 and a second pixel driving circuit PC2. The first pixel driving circuit PC1 is disposed in each of the sub-pixels SPXL, and the second pixel driving circuit PC2 is disposed in the common area CA inside the unit pixel PXL. The second pixel driving circuit PC2 is connected to the sub-pixels SPXL disposed inside the unit pixel. The first pixel driving circuit PC1 includes the light emitting element 130, a driving element, a first switching circuit, a second switching circuit, a third switching circuit, and a capacitor circuit.

FIGS. 4A and 4B illustrates pixel driving circuits included in pixels PXL of an nth row. The pixel driving circuits of the nth row are supplied with an (n-1)th scan signal S(n-1), an nth scan signal S(n), and an nth emission signal EM(n). The (n-1)th scan signal S(n-1) is configured to be supplied through an (n-1)th scan line, the nth scan signal S(n) is configured to be supplied through an nth scan line, and the nth emission signal EM(n) is configured to be supplied through an nth emission line. The (n-1)th scan line, the nth scan line, and the nth emission line are included in the gate lines 301.

The driving element generates a driving current corresponding to the data voltage Vdata and supplies the driving current to the cathode electrode of the light emitting element 130. The cathode electrode of the light emitting element 130 and a source of the driving element are connected at an N1 node. The anode electrode of the light emitting element 130 is connected to an N5 node. The N5 node is connected to a first common line 101 and supplied with the high-potential voltage VDD from the second pixel driving circuit PC2. The first common line 101 is a single line disposed commonly in the sub-pixels SPXL of the unit pixel PXL. Further, the cathode electrode of the light emitting element 130 is separately disposed for each of the sub-pixels SPXL in order to supply different driving currents to the respective sub-pixels SPXL.

When the light emitting element 130 emits light, a voltage of the cathode electrode of the light emitting element 130 is lower than a voltage of the anode electrode of the light emitting element 130. In the pixel driving circuit, the driving element and switching circuits except the light emitting element 130 generate a driving current so that the cathode electrode of the light emitting element 130 has a voltage lower than the high-potential voltage VDD in order to cause the light emitting element 130 to emit light.

The pixel driving circuit according to an embodiment of the present disclosure may be implemented by P-type transistors, particularly PMOS TFTs (P-channel metal oxide semiconductor thin film transistors). However, the present disclosure is not limited thereto. The pixel driving circuit according to an embodiment of the present disclosure may also be implemented by N-type transistors. In this case, the N-type transistors may be NMOS TFTs (N-channel metal oxide semiconductor thin film transistors). Herein, when the P-type transistors are turned off, a gate voltage is a logic high voltage, and when the N-type transistors are turned off, a gate voltage is a logic low voltage.

For example, the cathode electrode of the light emitting element 130 may be connected to the second power supply line supplied with the low-potential voltage VSS and the anode electrode may be configured to be supplied with a driving current generated from the driving element. In this case, if any one or more transistors of the driving element and switching circuits have a defect due to the influence of static electricity, a gate voltage in a turned-off transistor is a logic high voltage. Therefore, the anode electrode of the light emitting element 130 is influenced, and, thus, a bright spot is easily generated. Specifically, there may be a case where a gate insulating layer of a transistor breaks down due to static electricity and a short occurs between a gate and an active layer. A logic high voltage transferred through the shorted gate and active layer is transferred to the anode electrode of the light emitting element 130 so that the light emitting element 130 emits light. Therefore, in order for the light emitting element 130 not to emit light unnecessarily and be seen as a bright spot, the second pixel driving circuit PC2 and the first common line 101 are connected to each other. Thus, the high-potential voltage VDD is applied to the anode electrode of the light emitting element 130. The cathode electrode is electrically connected to the first pixel driving circuit PC1. Thus, it is possible to suppress the generation of a bright spot in the display panel.

Referring to FIG. 4A, the driving element is implemented by a first transistor T1. A gate of the first transistor T1 is connected to an N2 node, a source is connected to the N1 node, and a drain is connected to an N3 node. The driving element may be turned on by a gate voltage so as to supply a uniform driving current to the N1 node. The driving element may have a top gate structure where a gate is provided on an active layer and a coplanar structure where a source and a drain are in contact with an active layer through contact holes. Further, a conductive layer is disposed under the active layer of the driving element. The conductive layer may block light incident to the active layer of the driving element and thus suppress the degradation of the active layer. The conductive layer is not floated and is connected to the source of the first transistor T1. Thus, the uniformity in driving current and brightness can be improved. Referring to FIG. 4B, the conductive layer may be connected to the gate of the first transistor T1. If the conductive layer is connected to the source of the driving element, a driving current of the driving element decreases compared with a case where the conductive layer is connected to the gate of the driving element. However, the uniformity in brightness of the display panel can be improved. If the conductive layer is connected to the gate of the driving element, the uniformity in brightness of the display panel decreases compared with a case where the conductive layer is connected to the source of the driving element. However, a driving current of the driving element can be increased.

An N1 switching circuit includes a fourth transistor T4. The fourth transistor T4 is controlled by the nth scan signal S(n) so as to supply the N1 node with the data voltage Vdata flowing through the data line 201. Since the data voltage Vdata is configured to be supplied to the N1 node, the driving element can generate a driving current corresponding to the data voltage Vdata.

An N2 switching circuit includes a second transistor T2 and a third transistor T3. The second transistor T2 is controlled by the (n-1)th scan signal S(n-1) so as to supply the N2 node with the low-potential voltage VSS flowing through the second power supply line. Due to the low-potential voltage VSS supplied to the N2 node, the gate of the first transistor T1 is discharged with the low-potential voltage VSS. Therefore, when a threshold voltage of the driving element is compensated for and a driving current is generated, a voltage can be applied precisely to the gate of the driving element.

The third transistor T3 is controlled by the nth scan signal S(n) so as to electrically connect the N2 node and the N3 node. The third transistor T3 extracts a threshold voltage of the driving element by electrically connecting the gate and the drain of the driving element. The extracted threshold voltage is reflected in a gate voltage of the driving element and finally offset at a driving current generated by the driving element. Therefore, the threshold voltage of the driving element is compensated for.

N3 switching circuit includes a fifth transistor T5. The fifth transistor T5 is controlled by the nth emission signal EM(n) so as to supply the N3 node with the low-potential voltage VSS. Since the fifth transistor T5 supplies the low-potential voltage VSS to the drain of the driving element, a driving current can be generated.

The capacitor circuit includes a first capacitor Cst1 and a second capacitor Cst2. The first capacitor Cst1 includes two electrodes connected to the N2 node and the N4 node, respectively. The N4 node is connected to the second pixel driving circuit PC2 through a second common line 102 and applied with the high-potential voltage VDD or the reference voltage Vref through the second pixel driving circuit PC2.

The first capacitor Cst1 regulates a voltage of the N2 node by using a coupling effect of the capacitor elements and fixes a voltage applied to the gate of the driving element during light emission. This results in a uniform driving current and light emission brightness.

The first capacitor Cst1 is implemented by overlapping two electrodes. One of the electrodes is connected to the N2 node and thus connected to the gate of the driving element. The other electrode of the first capacitor Cst1 is disposed on the gate of the driving element so as to overlap a part of the gate. Further, an insulating layer is disposed between the two electrodes of the first capacitor Cst1.

For example, in a pixel driving circuit having a gamma structure in which a cathode electrode of a light emitting element is shared by a plurality of sub-pixels, a capacitor may be connected to a gate of a driving element. In this case, an insulating layer covering a transistor breaks down due to static electricity generated during a process of forming the pixel driving circuit, and, thus, two electrodes of the capacitor may be shorted to each other. When the two electrodes of the capacitor are shorted to each other, a corresponding sub-pixel SPXL can be seen as a bright spot. A bright spot can be seen more easily than a dark spot and thus degrades image quality. Therefore, according to embodiments of the present disclosure, the pixel driving circuit, e.g., the pixel driving circuit having an inverse gamma structure in which an anode electrode of a light emitting element is shared by a plurality of sub-pixels is used. Thus, the image quality of the electroluminescent display device can be improved.

The second capacitor Cst2 includes two electrodes. One electrode of the second capacitor Cst2 is connected to the gate of the first transistor T1 and the other electrode is connected to a line supplied with the high-potential voltage VDD. That is, a part of the gate of the first transistor T1, which is connected to the one electrode of the second capacitor Cst2, may be disposed to overlap a part of the line supplied with the high-potential voltage VDD or the other electrode connected to the line supplied with the high-potential voltage VDD. Also, referring to FIG. 4B, one electrode of the second capacitor Cst2 may be connected to the source of the first transistor T1 and the other electrode may be connected to a line supplied with the high-potential voltage VDD. Even if the two electrodes of the second capacitor Cst2 are shorted due to static electricity or the like, the high-potential voltage VDD is configured to be supplied to the other electrode of the second capacitor Cst2. Thus, the high-potential voltage VDD is also supplied to the gate of the driving element. Therefore, the driving element is turned off and the sub-pixel SPXL is darkened.

Also, since the two capacitors are connected to the gate of the driving element, the gate voltage of the driving element may not be influenced even by a coupling effect caused by a parasitic capacitor generated by the other switching transistors.

The second pixel driving circuit PC2 includes a first common switching circuit and a second common switching circuit.

The first common switching circuit includes a first common transistor TC1. The first common switching circuit is configured to apply a voltage to the N5 node through the first common line 101.

The first common transistor TC1 is controlled by the nth emission signal EM(n) so as to apply the high-potential voltage VDD to the N5 node. Since the first common transistor TC1 supplies the high-potential voltage VDD to the anode electrode of the light emitting element 130, the light emitting element 130 emits light.

The second common switching circuit includes a second common transistor TC2, a third common transistor TC3, and a fourth common transistor TC4. The second common switching circuit is configured to supply a voltage to the N4 node through the second common line 102.

The second common transistor TC2 is controlled by the nth emission signal EM(n) so as to apply the high-potential voltage VDD to the N4 node. The second common transistor TC2 applies the high-potential voltage VDD to the other electrode of the first capacitor Cst1 to maintain the gate voltage of the driving element. Thus, the driving element can generate a uniform driving current.

The third common transistor TC3 is controlled by the nth scan signal S(n) so as to apply the reference voltage Vref to the N4 node. The third common transistor TC3 applies the reference voltage Vref to the other electrode of the first capacitor Cst1 to sample the threshold voltage of the driving element. Thus, a driving current can be generated.

The fourth common transistor TC4 is controlled by the (n-1)th scan signal S(n-1) so as to apply the reference voltage Vref to the N4 node. The fourth common transistor TC4 applies the reference voltage Vref to the other electrode of the first capacitor Cst1 to supply a constant voltage to the N4 node, which is floated after light emission. Thus, in a sampling period, a voltage can be coupled and applied precisely to the gate of the driving element.

The second pixel driving circuit PC2 is not directly connected to the driving element and supplies a constant voltage of the high-potential voltage VDD or the reference voltage Vref to the N4 node and the N5 node. Thus, the second pixel driving circuit PC2 can be shared by the plurality of the sub-pixels SPXL included in the unit pixel PXL. The second pixel driving circuit PC2 may also be shared by a plurality of pixels PXL depending on the size of transistors of the second pixel driving circuit PC2. In this case, the size of the transistors may be determined by the charging time of the first capacitor Cst1.

Referring to FIG. 3, the second pixel driving circuit PC2 may be disposed in the common area CA of the pixel PXL and shared by the sub-pixels SPXL. In this case, the first common line 101 and the second common line 102 are shared by the sub-pixels SPXL. Therefore, the size of the sub-pixels SPXL can be reduced, and, thus, the size of the unit pixel PXL can be reduced. Accordingly, it is possible to implement a high-resolution display panel.

Referring to FIG. 4A, FIG. 4B, and FIG. 5, the pixel driving circuit is driven in a period divided into an initialization period ①, a sampling period ②, a holding period ③ ③, and an emission period ④.

Each of the (n-1)th scan signal S(n-1) and the nth scan signal S(n) includes a pulse of a logic low voltage during one horizontal period 1H. The nth emission signal EM(n) includes a pulse of a logic high voltage during at least two horizontal periods 2H. The one horizontal period 1H in which the (n-1)th scan signal S(n-1) has a logic low voltage is referred to as the initialization period ① of the pixel driving circuit. Also, the one horizontal period 1H in which the nth scan signal S(n) has a logic low voltage is referred to as the sampling period ② of the pixel driving circuit. Although FIG. 5 illustrates that the nth emission signal EM(n) has a logic high voltage during four horizontal periods 4H, the present disclosure is not limited thereto. The nth emission signal EM(n) has a logic high voltage at least during the initialization period ① and the sampling period ② of the pixel driving circuit and thus suppresses light emission of the light emitting element 130. The nth emission signal EM(n) may have a logic low voltage during a period other than the initialization period ① and the sampling period ② or a period other than the four horizontal periods 4H. The period in which the nth emission signal EM(n) has a logic low voltage is referred to as the emission period ④ of the pixel driving circuit.

In the initialization period ①, the second transistor T2 of the first pixel driving circuit PC1 is turned on and the low-potential voltage VSS is applied to the N2 node. Also, the fourth common transistor TC4 of the second pixel driving circuit PC2 is turned on and the reference voltage Vref is applied to the N4 node. Therefore, the gate of the first transistor T1 is discharged with the low-potential voltage VSS, and one electrode of each of the first capacitor Cst1 and the second capacitor Cst2 is also discharged with the low-potential voltage VSS.

In the sampling period ②, the third common transistor TC3 of the second pixel driving circuit PC2 is turned on and the reference voltage Vref is applied to the N4 node. The N4 node maintains the reference voltage Vref during the sampling period ② as well as the initialization period ①.

In the sampling period ②, the fourth transistor T4 of the first pixel driving circuit PC1 is turned on and the data voltage Vdata is applied to the N1 node. Also, the third transistor T3 is turned on and the N2 node and the N3 node are electrically connected. Therefore, the gate and the drain of the driving element are shorted. Thus, a voltage of the N2 node increases until a difference between the voltage of the N2 node and a voltage of the N1 node is equal to a threshold voltage Vth of the driving element. Accordingly, at the end of the sampling period ②, the voltage of the N2 node becomes Vdata+Vth. The voltage increase of the N2 node takes time. A sufficient sampling time is beneficial to precisely sample a threshold voltage of the driving element. It also takes time to completely convert the nth scan signal S(n) into a logic high voltage. Therefore, the holding period ③ may be set after the sampling period ②.

The holding period ③ is illustrated as one horizontal period 1H, but the present disclosure is not limited thereto. In order for the light emitting element 130 not to emit light even during the holding period ③, the nth emission signal EM(n) maintains a logic high voltage. When the nth emission signal EM(n) is converted into a logic low voltage, the light emitting element 130 starts to emit light.

In the emission period ④, the second common transistor TC2 of the second pixel driving circuit PC2 is turned on and the high-potential voltage VDD is applied to the N4 node. As a voltage of the N4 node is changed from the reference voltage Vref to the high-potential voltage VDD, the voltage of the N2 node becomes Vdata+Vth+VDD-Vref due to coupling of the first capacitor Cst1.

In the emission period ④, the fifth transistor T5 of the first pixel driving circuit PC1 is turned on and the low-potential voltage VSS is applied to the N3 node. Thus, the driving element is turned on and a driving current is configured to be supplied to the light emitting element 130. Also, the first common transistor TC1 of the second pixel driving circuit PC2 is turned on and the high-potential voltage VDD is applied to the anode electrode of the light emitting element 130. Thus, the light emitting element 130 emits light. In this case, a source voltage of the driving element becomes VDD-$V_{TC1}$-$V_{lcd}$, and a driving current $I_D$ of the driving element is represented by the following Equation 1.

$$I_D = k(\text{Vdata} - \text{Vref} + V_{TC1} - V_{led})^2 \quad \text{Equation 1}$$

In Equation 1, k is a constant value determined by the characteristics of the driving element, $V_{led}$ is a threshold voltage of the light emitting element 130, and $V_{TC1}$ is a threshold voltage of the first common transistor TC1. Referring to Equation 1, the threshold voltage Vth of the driving element is removed from the driving current $I_D$. Therefore, the driving current $I_D$ does not depend on the threshold voltage Vth of the driving element and is not influenced by a change in the threshold voltage Vth.

Also, the driving current $I_D$ is not influenced by the high-potential voltage VDD that experiences a voltage drop due to the influence of a current. However, the driving current $I_D$ is influenced by the reference voltage Vref that is hardly influenced by a voltage drop due to a constant voltage applied thereto. Therefore, it is possible to suppress a change in brightness depending on the location of a pixel PXL on the display panel.

Figure 6:
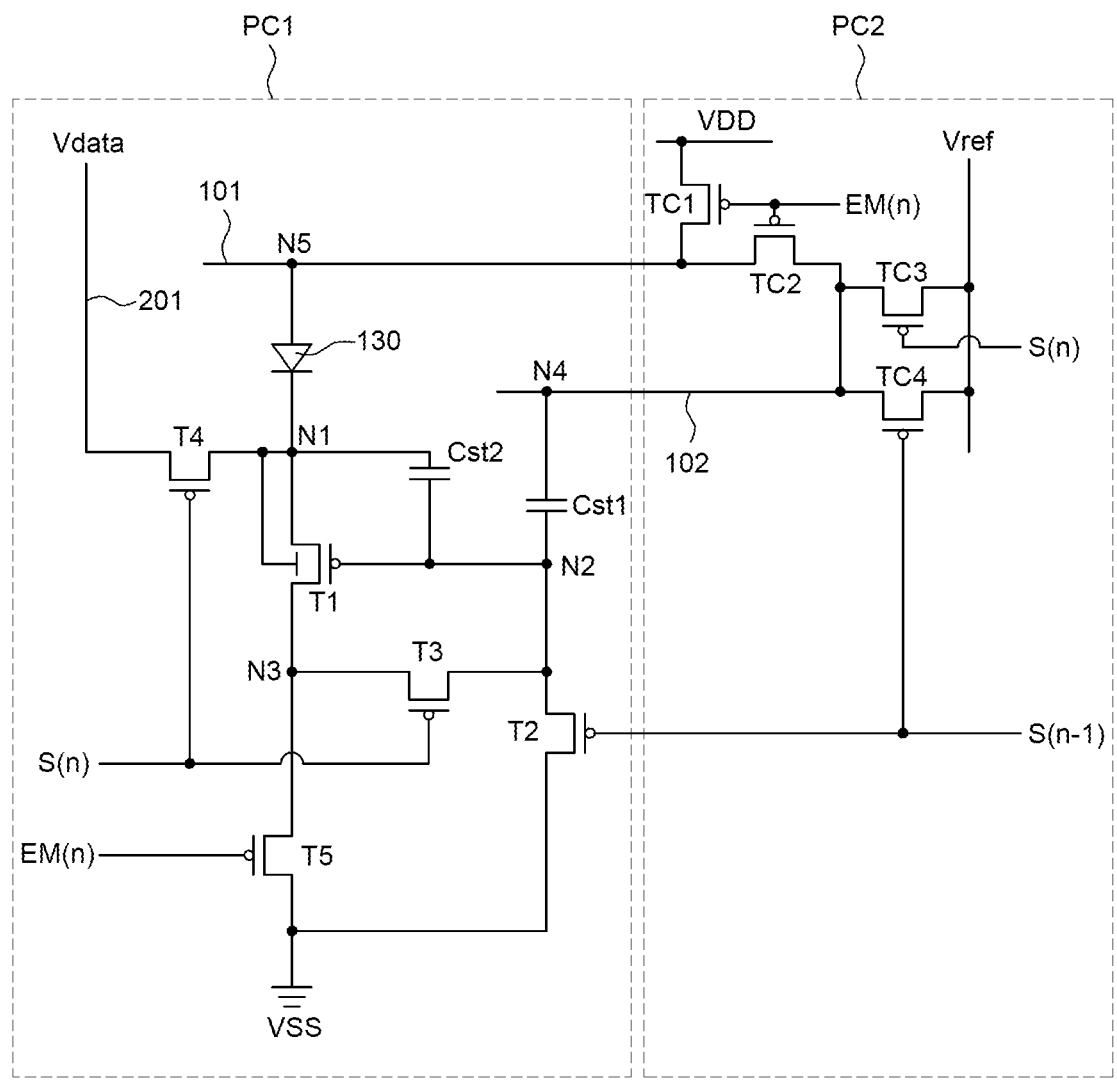
FIG. 6 illustrates a pixel driving circuit according to another embodiment of the present disclosure.

FIG. 6 illustrates a pixel driving circuit according to another embodiment of the present disclosure. A waveform chart of a signal applied to the pixel driving circuit shown in FIG. 6 is the same as the waveform chart shown in FIG. 5 and thus will be described with reference to FIG. 5.

Referring to FIG. 6, the pixel driving circuit according to another embodiment of the present disclosure includes a first pixel driving circuit PC1 and a second pixel driving circuit PC2. The first pixel driving circuit PC1 is disposed in each of the sub-pixels SPXL, and the second pixel driving circuit PC2 is disposed in the common area CA inside the unit pixel PXL. The second pixel driving circuit PC2 is connected to the sub-pixels SPXL disposed inside the unit pixel PXL. The first pixel driving circuit PC1 includes the light emitting element 130, a driving element, a first switching circuit, a second switching circuit, a third switching circuit, and a capacitor circuit.

FIG. 6 illustrates pixel driving circuits included in pixels PXL of an nth row. The pixel driving circuits of the nth row are supplied with an (n-1)th scan signal S(n-1), an nth scan signal S(n), and an nth emission signal EM(n). The (n-1)th scan signal S(n-1) is configured to be supplied through an (n-1)th scan line, the nth scan signal S(n) is configured to be supplied through an nth scan line, and the nth emission signal EM(n) is configured to be supplied through an nth emission line. The (n-1)th scan line, the nth scan line, and the nth emission line are included in the gate lines 301.

The driving element generates a driving current corresponding to the data voltage Vdata and supplies the driving current to the cathode electrode of the light emitting element 130. The cathode electrode of the light emitting element 130 and a source of the driving element are connected at an N1 node. The anode electrode of the light emitting element 130 is connected to an N5 node. The N5 node is connected to a first common line 101 and supplied with the high-potential voltage VDD from the second pixel driving circuit PC2. The first common line 101 is a single line disposed commonly in the sub-pixels SPXL of the unit pixel PXL. Further, the cathode electrode of the light emitting element 130 is separately disposed for each of the sub-pixels SPXL in order to supply different driving currents to the respective sub-pixels SPXL.

When the light emitting element 130 emits light, a voltage of the cathode electrode is lower than a voltage of the anode electrode. In the pixel driving circuit, the driving element and switching circuits except the light emitting element 130 generate a driving current so that the cathode electrode of the light emitting element 130 has a voltage lower than the high-potential voltage VDD in order to cause the light emitting element 130 to emit light.

The pixel driving circuit according to another embodiment of the present disclosure may be implemented by P-type transistors, particularly PMOS TFTs (P-channel metal oxide semiconductor thin film transistors). However, the present disclosure is not limited thereto. The pixel driving circuit according to another embodiment of the present disclosure may also be implemented by N-type transistors. In this case, the N-type transistors may be NMOS TFTs (N-channel metal oxide semiconductor thin film transistors). Herein, when the P-type transistors are turned off, a gate voltage is a logic high voltage, and when the N-type transistors are turned off, a gate voltage is a logic low voltage.

As in the pixel driving circuit according to an embodiment of the present disclosure, in order for the light emitting element 130 not to emit light unnecessarily and be seen as a bright spot, the second pixel driving circuit PC2 and the first common line 101 are connected to each other in the pixel driving circuit according to another embodiment of the present disclosure. Thus, the high-potential voltage VDD is applied to the anode electrode of the light emitting element 130. The cathode electrode is electrically connected to the pixel driving circuit. Thus, it is possible to suppress the generation of a bright spot in the display panel.

The driving element is implemented by a first transistor T1. A gate of the first transistor T1 is connected to an N2 node, a source is connected to the N1 node, and a drain is connected to an N3 node. The driving element may be turned on by a gate voltage so as to supply a uniform driving current to the N1 node. As described above, a conductive layer is disposed under the active layer of the driving element. The conductive layer is not floated and is connected to the source of the first transistor T1. Thus, the uniformity in driving current and brightness can be improved. Although FIG. 6 illustrates that the conductive layer is connected to the source of the first transistor T1, but the present disclosure is not limited thereto. As shown in FIG. 4B, the conductive layer may be connected to the gate of the first transistor T1.

An N1 switching circuit includes a fourth transistor T4. The fourth transistor T4 is controlled by the nth scan signal S(n) so as to supply the N1 node with the data voltage Vdata flowing through the data line 201. Since the data voltage Vdata is configured to be supplied to the N1 node, the driving element can generate a driving current corresponding to the data voltage Vdata.

An N2 switching circuit includes a second transistor T2 and a third transistor T3. The second transistor T2 is controlled by the (n-1)th scan signal S(n-1) so as to supply the N2 node with the low-potential voltage VSS flowing through the second power supply line. Due to the low-potential voltage VSS supplied to the N2 node, the gate of the first transistor T1 is discharged with the low-potential voltage VSS. Therefore, when a threshold voltage of the driving element is compensated for and a driving current is generated, a voltage can be applied precisely to the gate of the driving element.

The third transistor T3 is controlled by the nth scan signal S(n) so as to electrically connect the N2 node and the N3 node. The third transistor T3 extracts a threshold voltage of the driving element by electrically connecting the gate and the drain of the driving element. The extracted threshold voltage is reflected in a gate voltage of the driving element and finally offset at a driving current generated by the driving element. Therefore, the threshold voltage of the driving element is compensated for.

An N3 switching circuit includes a fifth transistor T5. The fifth transistor T5 is controlled by the nth emission signal EM(n) so as to supply the N3 node with the low-potential voltage VSS. Since the fifth transistor T5 supplies the low-potential voltage VSS to the drain of the driving element, a driving current can be generated.

The capacitor circuit includes a first capacitor Cst1 and a second capacitor Cst2. The first capacitor Cst1 includes two electrodes connected to the N2 node and the N4 node, respectively. The N4 node is connected to the second pixel driving circuit PC2 through a second common line 102 and applied with the high-potential voltage VDD or the reference voltage Vref through the second pixel driving circuit PC2.

The first capacitor Cst1 regulates a voltage of the N2 node by using a coupling effect of the capacitor elements and fixes a voltage applied to the gate of the driving element during light emission. This results in a uniform driving current and light emission brightness.

The first capacitor Cst1 is implemented by overlapping two electrodes. One of the electrodes is connected to the N2 node and thus connected to the gate of the driving element. The other electrode of the first capacitor Cst1 is disposed on the gate of the driving element so as to overlap a part of the gate. Further, an insulating layer is disposed between the two electrodes of the first capacitor Cst1.

As described above, in a capacitor of a pixel driving circuit having a gamma structure, one electrode and the other electrode may be shorted to each other due to static electricity generated during a process. When the two electrodes of the capacitor are shorted to each other, a corresponding sub-pixel SPXL can be seen as a bright spot. A bright spot can be seen more easily than a dark spot and thus degrades image quality. Therefore, even when capacitors disposed in a pixel driving circuit having an inverse gamma structure are shorted, a driving element is turned off. Thus, a corresponding sub-pixel SPXL can be darkened.

The second capacitor Cst2 includes two electrodes. One electrode of the second capacitor Cst2 is connected to the gate of the first transistor T1 and the other electrode is connected to the N1 node. That is, a part of the gate of the first transistor T1, which is connected to the one electrode of the second capacitor Cst2, may be disposed to overlap a part of an electrode of the N1 node or the other electrode connected to the N1 node. Even if the two electrodes of the second capacitor Cst2 are shorted due to static electricity or the like, the shorted second capacitor Cst2 makes a voltage difference of 0 V between the source and the gate of the driving element. Therefore, the driving element is turned off and the sub-pixel SPXL is darkened.

Also, since the two capacitors are connected to the gate of the driving element, the gate voltage of the driving element may not be influenced even by a coupling effect caused by a parasitic capacitor generated by the other switching transistors.

The second pixel driving circuit PC2 includes a first common switching circuit, a second common switching circuit, and a third common switching circuit.

The first common switching circuit includes a first common transistor TC1. The first common switching circuit is configured to apply a voltage to the N5 node through the first common line 101.

The first common transistor TC1 is controlled by the nth emission signal EM(n) so as to apply the high-potential voltage VDD to the N5 node. Since the first common transistor TC1 supplies the high-potential voltage VDD to the anode electrode of the light emitting element 130, the light emitting element 130 emits light.

The second common switching circuit includes a third common transistor TC3 and a fourth common transistor TC4. The second common switching circuit is configured to supply a voltage to the N4 node through the second common line 102.

The third common transistor TC3 is controlled by the nth scan signal S(n) so as to apply the reference voltage Vref to the N4 node. The third common transistor TC3 applies the reference voltage Vref to the other electrode of the first capacitor Cst1 to sample the threshold voltage of the driving element. Thus, a driving current can be generated.

The fourth common transistor TC4 is controlled by the (n-1)th scan signal S(n-1) so as to apply the reference voltage Vref to the N4 node. The fourth common transistor TC4 applies the reference voltage Vref to the other electrode of the first capacitor Cst1 to supply a constant voltage to the N4 node, which is floated after light emission. Thus, in a sampling period, a voltage can be coupled and applied precisely to the gate of the driving element.

A third common switching circuit includes a second common transistor TC2. The second common transistor TC2 is controlled by the nth emission signal EM(n) so as to electrically connect the N4 node and the N5 node. The second common transistor TC2 makes a voltage of the N4 node equal to a voltage of the N5 node. Thus, a voltage value of the N5 node is reflected in the N4 node and applied to the other electrode of the first capacitor Cst1. The voltage value of the N5 node is reflected in the gate voltage of the driving element due to coupling of the first capacitor Cst1, and, thus, the driving element generates a precise driving current.

The second pixel driving circuit PC2 is not directly connected to the driving element and supplies a constant voltage of the high-potential voltage VDD or the reference voltage Vref to the N4 node and the N5 node. Thus, the second pixel driving circuit PC2 can be shared by the plurality of the sub-pixels SPXL included in the unit pixel PXL. The second pixel driving circuit PC2 may also be shared by a plurality of pixels PXL depending on the size of transistors of the second pixel driving circuit PC2. In this case, the size of the transistors may be determined by the charging time of the first capacitor Cst1.

Referring to FIG. 3, the second pixel driving circuit PC2 may be disposed in the common area CA of the pixel PXL and shared by the sub-pixels SPXL. In this case, the first common line 101 and the second common line 102 are shared by the sub-pixels SPXL. Therefore, the size of the sub-pixels SPXL can be reduced, and, thus, the size of the unit pixel PXL can be reduced. Accordingly, it is possible to implement a high-resolution display panel.

Referring to FIG. 6 and FIG. 5, the pixel driving circuit is driven in a period divided into the initialization period ①, the sampling period ②, the holding period ③ ®, and the emission period ④.

Each of the (n-1)th scan signal S(n-1) and the nth scan signal S(n) includes a pulse of a logic low voltage during one horizontal period 1H. The nth emission signal EM(n) includes a pulse of a logic high voltage during at least two horizontal periods 2H. The one horizontal period 1H in which the (n-1)th scan signal S(n-1) has a logic low voltage is referred to as the initialization period ① of the pixel driving circuit. Also, the one horizontal period 1H in which the nth scan signal S(n) has a logic low voltage is referred to as the sampling period ② of the pixel driving circuit. Although FIG. 5 illustrates that the nth emission signal EM(n) has a logic high voltage during four horizontal periods 4H, the present disclosure is not limited thereto. The nth emission signal EM(n) has a logic high voltage at least during the initialization period ① and the sampling period ② of the pixel driving circuit and thus suppresses light emission of the light emitting element 130. The nth emission signal EM(n) may have a logic low voltage during a period other than the initialization period ① and the sampling period ② or a period other than the four horizontal periods 4H. The period in which the nth emission signal EM(n) has a logic low voltage is referred to as the emission period ④ of the pixel driving circuit.

In the initialization period ①, the second transistor T2 of the first pixel driving circuit PC1 is turned on and the low-potential voltage VSS is applied to the N2 node. Also, the fourth common transistor TC4 of the second pixel driving circuit PC2 is turned on and the reference voltage Vref is applied to the N4 node. Therefore, the gate of the first transistor T1 is discharged with the low-potential voltage VSS, and one electrode of each of the first capacitor Cst1 and the second capacitor Cst2 is also discharged with the low-potential voltage VSS.

In the sampling period ②, the third common transistor TC3 of the second pixel driving circuit PC2 is turned on and the reference voltage Vref is applied to the N4 node. The N4 node maintains the reference voltage Vref during the sampling period ② as well as the initialization period ①.

In the sampling period ②, the fourth transistor T4 of the first pixel driving circuit PC1 is turned on and the data voltage Vdata is applied to the N1 node. Also, the third transistor T3 is turned on and the N2 node and the N3 node are electrically connected. Therefore, the gate and the drain of the driving element are shorted. Thus, a voltage of the N2 node increases until a difference between the voltage of the N2 node and a voltage of the N1 node is equal to a threshold voltage Vth of the driving element. Accordingly, at the end of the sampling period ②, the voltage of the N2 node becomes Vdata+Vth. The voltage increase of the N2 node takes time. A sufficient sampling time is beneficial to precisely sample a threshold voltage of the driving element. It also takes time to completely convert the nth scan signal S(n) into a logic high voltage. Therefore, the holding period ③ may be set after the sampling period ②.

The holding period ③ is illustrated as one horizontal period 1H, but the present disclosure is not limited thereto. In order for the light emitting element 130 not to emit light even during the holding period ③, the nth emission signal EM(n) maintains a logic high voltage. When the nth emission signal EM(n) is converted into a logic low voltage, the light emitting element 130 starts to emit light.

In the emission period ④, the first common transistor TC1 of the second pixel driving circuit PC2 is turned on and the high-potential voltage VDD is applied to the N5 node. Also, the second common transistor TC2 is turned on and the voltage of the N4 node becomes equal to the voltage of the N5 node. In this case, a voltage substantially applied to the N5 node has a value obtained by reflecting a threshold voltage $V_{TC1}$ of the first common transistor in the high-potential voltage VDD. Likewise, the voltage of the N4 node is changed from the reference voltage Vref to a difference between the high-potential voltage VDD and the threshold voltage $V_{TC1}$ of the first common transistor. The voltage of the N2 node becomes Vdata+Vth+VDD−Vref−$V_{TC1}$ due to coupling of the first capacitor Cst1.

In the emission period ④, the fifth transistor T5 of the first pixel driving circuit PC1 is turned on and the low-potential voltage VSS is applied to the N3 node. Thus, the driving element is turned on and a driving current is configured to be supplied to the light emitting element 130. Thus, the light emitting element 130 emits light. In this case, a source voltage of the driving element becomes VDD−$V_{TC1}$−$V_{led}$. Therefore, a driving current $I_D$ of the driving element is represented by the following Equation 2.

$$I_D = k(\text{Vdata} - \text{Vref} - V_{led})^2$$

In Equation 2, k is a constant value determined by the characteristics of the driving element, $V_{TC1}$ is a threshold voltage of the first common transistor TC1, and $V_{led}$ is a threshold voltage of the light emitting element 130. Referring to Equation 2, the threshold voltage Vth of the driving element is removed from the driving current $I_D$. Therefore, the driving current $I_D$ does not depend on the threshold voltage Vth of the driving element and is not influenced by a change in the threshold voltage Vth. Also, unlike an embodiment of the present disclosure, the threshold voltage $V_{TC1}$ of the first common transistor is removed from the driving current $I_D$. Therefore, the driving current $I_D$ is not influenced by a change in the threshold voltage $V_{TC1}$ of the first common transistor TC1. Accordingly, it is possible to secure the reliability of the driving current $I_D$ and improve the uniformity in brightness of the display panel.

Also, the driving current $I_D$ is not influenced by the high-potential voltage VDD that experiences a voltage drop due to the influence of a current. However, the driving current $I_D$ is influenced by the reference voltage Vref that is hardly influenced by a voltage drop due to a constant voltage applied thereto. Accordingly, it is possible to suppress a change in brightness depending on the location of a pixel PXL on the display panel.

The embodiments of the present disclosure can also be described as follows:

According to an aspect of the present disclosure, the electroluminescent display device includes a pixel that includes sub-pixels and is divided into a sub-pixel area where the sub-pixels are disposed and a common area. Each of the sub-pixels includes a light emitting element including an anode electrode and a cathode electrode. In the sub-pixel area, a first pixel driving circuit is disposed, and in the common area, a second pixel driving circuit is disposed. The anode electrode of the light emitting element is connected to a first common line which is connected to the second pixel driving circuit. Each of the sub-pixels further includes a driving element including a source connected to a first node, a gate connected to a second node, and a drain connected to a third node. The sub-pixel also includes a fourth transistor connected to the first node, a second transistor connected to the second node, and a fifth transistor connected to the third node. The sub-pixel further includes a third transistor connected to the second node and the third node, and a first capacitor connected to the second node and a second common line which is connected to the second pixel driving circuit. The sub-pixel also includes a second capacitor connected to the first common line and the first node or the second node, and a conductive layer disposed under the driving element. The conductive layer is connected to the first node or the gate of the driving element. In this case, when a defect is generated in a sub-pixel of the electroluminescent display device due to static electricity, the sub-pixel is darkened. Thus, it is possible to reduce an image quality defect.

The second pixel driving circuit may include a first common switching circuit configured to apply a voltage to the first common line and a second common switching circuit configured to apply a voltage to the second common line.

The sub-pixels may be connected to each other through the first common line and the second common line.

The second common switching circuit may be connected to a line configured to supply a reference voltage, and the reference voltage may be configured to be supplied to the gate of the driving element to turn on the driving element.

The second pixel driving circuit may be implemented by transistors controlled by an (n-1)th scan signal, an nth scan signal, and an nth emission signal.

The fourth transistor may be controlled by an nth scan signal so as to supply a data voltage to the first node.

The second transistor may be controlled by an (n-1)th scan signal and connected to a line supplied with a low-potential voltage so as to supply the low-potential voltage to the second node.

The fifth transistor may be controlled by an nth emission signal and connected to a line supplied with a low-potential voltage so as to supply the low-potential voltage to the third node.

The third transistor may be controlled by an nth scan signal so as to electrically connect the second node and the third node.

According to another aspect of the present disclosure, the electroluminescent display device includes a light emitting element including an anode electrode connected to a first common line supplied with a high-potential voltage and a cathode electrode. The electroluminescent display device also includes a sub-pixel including a pixel driving circuit that supplies a driving current to the light emitting element. The sub-pixel further includes a driving element including a source connected to a first node, a gate connected to a second node, and a drain connected to a third node. The sub-pixel also includes a first common switching circuit connected to the anode electrode and a first capacitor including a first electrode connected to the second node and a second electrode connected to a fourth node. The sub-pixel further includes a second switching circuit connected to the second node and a third switching circuit connected to the third node. The sub-pixel also includes a first switching circuit connected to the first node and a second common switching circuit connected to the fourth node. Accordingly, when a defect is generated in a sub-pixel of the electroluminescent display device due to static electricity, the sub-pixel is darkened. Thus, it is possible to reduce an image quality defect.

The first common switching circuit may be controlled by an nth emission signal so as to supply the high-potential voltage to the first common line and electrically connect the fourth node and the first common line.

The second switching circuit may be controlled by an nth scan signal so as to electrically connect the second node and the third node, and may be controlled by an (n-1)th scan signal so as to supply a low-potential voltage to the second node.

The third switching circuit may be controlled by an nth emission signal so as to supply a low-potential voltage to the third node.

The first switching circuit may be controlled by an nth scan signal so as to supply a data voltage to the first node.

The second common switching circuit may be controlled by an (n-1)th scan signal and an nth scan signal so as to supply the fourth node with a voltage higher than the high-potential voltage.

The sub-pixel may further include a conductive layer disposed under the driving element, and the conductive layer may be connected to the first node or the second node.

The sub-pixel may further include a second capacitor including one electrode connected to the second node and the other electrode connected to the first node.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
a pixel that includes sub-pixels and having a sub-pixel area where the sub-pixels are disposed and a common area,
wherein each of the sub-pixels includes a light emitting element including an anode electrode and a cathode electrode, and in the sub-pixel area, a first pixel driving circuit is disposed, and in the common area, a second pixel driving circuit is disposed, the second pixel driving circuit having a first common line and a second common line; the anode electrode of the light emitting element is electrically connected to the first common line, and wherein each of the sub-pixels further includes:
a driving element including a source electrically connected to a first node, a gate electrically connected to a second node, and a drain electrically connected to a third node;
a fourth transistor electrically connected to the first node;
a second transistor electrically connected to the second node;
a fifth transistor electrically connected to the third node;
a third transistor electrically connected to the second node and the third node;
a first capacitor having a first electrode electrically connected to the second node and a second electrode electrically connect to the second common line;
a second capacitor having a first capacitor electrode and a second capacitor electrode, the first capacitor electrode electrically connected to the first common line and the second capacitor electrode electrically connected to either the first node or the second node; and
a conductive layer disposed under the driving element, wherein the conductive layer is electrically connected to the first node or the gate of the driving element.

2. The electroluminescent display device according to claim 1, wherein the second pixel driving circuit includes a first common switching circuit configured to apply a voltage to the first common line and a second common switching circuit configured to apply a voltage to the second common line.

3. The electroluminescent display device according to claim 2, wherein the sub-pixels are electrically connected to each other through the first common line and the second common line.

4. The electroluminescent display device according to claim 2, wherein the second common switching circuit is electrically connected to a line configured to supply a reference voltage, and the reference voltage is configured to be supplied to the gate of the driving element to turn on the driving element.

5. The electroluminescent display device according to claim 1, wherein the second pixel driving circuit is implemented by transistors controlled by an (n-1)th scan signal, an nth scan signal, and an nth emission signal, and
wherein the second pixel driving circuit is included in a pixel of an nth row, n being a natural number.

6. The electroluminescent display device according to claim 1, wherein the fourth transistor is controlled by an nth scan signal and supplies a data voltage to the first node.

7. The electroluminescent display device according to claim 1, wherein the second transistor is controlled by an (n-1)th scan signal and electrically connected to a line supplied with a low-potential voltage, and supplies the low-potential voltage to the second node.

8. The electroluminescent display device according to claim 1, wherein the fifth transistor is controlled by an nth emission signal and electrically connected to a line supplied with a low-potential voltage, and supplies the low-potential voltage to the third node.

9. The electroluminescent display device according to claim 1, wherein the third transistor is controlled by an nth scan signal and electrically connects the second node and the third node.

10. An electroluminescent display device, comprising:
a light emitting element including an anode electrode electrically connected to a first common line supplied with a high-potential voltage and a cathode electrode; and
a sub-pixel including a pixel driving circuit that supplies a driving current to the light emitting element,
wherein the sub-pixel further includes:
a driving element including a source electrically connected to a first node, a gate electrically connected to a second node, and a drain electrically connected to a third node;
a first common switching circuit electrically connected to the anode electrode;
a first capacitor including a first electrode electrically connected to the second node and a second electrode electrically connected to a fourth node;
a second switching circuit electrically connected to the second node;
a third switching circuit electrically connected to the third node;
a first switching circuit electrically connected to the first node; and
a second common switching circuit electrically connected to the fourth node.

11. The electroluminescent display device according to claim 10, wherein the first common switching circuit is controlled by an nth emission signal and supplies the high-potential voltage to the first common line and electrically connect the fourth node and the first common line.

12. The electroluminescent display device according to claim 10, wherein the second switching circuit is controlled by an nth scan signal and electrically connects the second node and the third node, and is controlled by an (n-1)th scan signal and supplies a low-potential voltage to the second node.

13. The electroluminescent display device according to claim 10, wherein the third switching circuit is controlled by an nth emission signal and supplies a low-potential voltage to the third node.

14. The electroluminescent display device according to claim 10, wherein the first switching circuit is controlled by an nth scan signal and supplies a data voltage to the first node.

15. The electroluminescent display device according to claim 10, wherein the second common switching circuit is controlled by an (n-1)th scan signal and an nth scan signal and supplies the fourth node with a voltage higher than the high-potential voltage.

16. The electroluminescent display device according to claim 10, wherein
the sub-pixel further includes a conductive layer disposed under the driving element, and
the conductive layer is electrically connected to the first node or the second node.

17. The electroluminescent display device according to claim 10, wherein the sub-pixel further includes a second capacitor including one electrode electrically connected to the second node and the other electrode electrically connected to the first node.

18. The electroluminescent display device according to claim 17, wherein when the two electrodes of the second capacitor are shorted, a voltage difference between the source and the gate of the driving element becomes 0 V, and the driving element is turned off.

19. An electroluminescent display device, comprising:
- a pixel that includes sub-pixels, and is divided into a sub-pixel area where the sub-pixels and a first pixel driving circuit are disposed and a common area where a second pixel driving circuit is disposed,
- wherein each of the sub-pixels includes:
  - a light emitting element including an anode electrode and a cathode electrode, wherein the anode electrode is electrically connected to a first common line which is supplied with a high-potential voltage and electrically connected to the second pixel driving circuit;
  - a driving element including a source electrically connected to a first node, a gate electrically connected to a second node, and a drain electrically connected to a third node;
  - a fourth transistor electrically connected to the first node;
  - a second transistor electrically connected to the second node;
  - a fifth transistor electrically connected to the third node;
  - a third transistor electrically connected to the second node and the third node;
  - a first capacitor having a first electrode electrically connected to the second node and a second electrode electrically connect to a second common line which is electrically connected to the second pixel driving circuit; and
  - a second capacitor having a first electrode electrically connected to the second node and a second electrode electrically connected to the first common line,
- wherein, in operation, when the two electrodes of the second capacitor are shorted, the high-potential voltage is applied to the gate of the driving element and the driving element is turned off.

* * * * *